(12) United States Patent
Torii

(10) Patent No.: US 6,783,392 B1
(45) Date of Patent: Aug. 31, 2004

(54) CONNECTOR MOUNTING STRUCTURE

(75) Inventor: Chieko Torii, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 1005 days.

(21) Appl. No.: 09/100,346

(22) Filed: Jun. 19, 1998

(30) Foreign Application Priority Data

Jun. 20, 1997 (JP) .............................................. 9-164289

(51) Int. Cl.⁷ .............................................. H01R 13/73
(52) U.S. Cl. ........................ 439/572; 439/629; 439/404
(58) Field of Search ................................ 439/399–404, 439/572

(56) References Cited

U.S. PATENT DOCUMENTS

| | | | | |
|---|---|---|---|---|
| 3,665,375 A | * | 5/1972 | Thomas et al. | 439/629 |
| 4,054,767 A | * | 10/1977 | Anderson et al. | 439/95 |
| 4,494,813 A | * | 1/1985 | Daley, Jr. et al. | 439/404 |
| 4,558,912 A | * | 12/1985 | Coller et al. | 439/629 |

FOREIGN PATENT DOCUMENTS

| | | | | |
|---|---|---|---|---|
| GB | 2197548 A | * | 5/1988 | 439/399 |
| JP | 6-60067 | | 8/1994 | H01R/9/09 |

* cited by examiner

*Primary Examiner*—P. Austin Bradley
*Assistant Examiner*—Briggitte R. Hammond
(74) *Attorney, Agent, or Firm*—Sughrue Mion, PLLC

(57) ABSTRACT

A connector mounting structure includes a connector housing having terminal accommodating chambers, and wire connecting terminals accommodated in the terminal accommodating chambers. The terminals accommodated in the rightmost and leftmost ones of the terminal accommodating chambers are employed as dummy fixing terminals when the connector housing mounted on a printed circuit board. Fixing portions of the dummy fixing terminals are inserted into terminal insertion holes formed in the printed circuit board so that the fixing portions protrude from a rear surface of the printed circuit board. The fixing portions are secured to contacts of the printed circuit board by soldering.

11 Claims, 3 Drawing Sheets

CONNECTOR MOUNTING STRUCTURE

BACKGROUND OF THE INVENTION

1. Field of the Invention

This invention relates to a connector mounting structure that is suitable for fixedly mounting a connector, which has press-connecting terminals, on a printed circuit board.

The present application is based on Japanese Application No. Hei. 9-164289, which is incorporated herein by reference.

2. Description of the Related Art

A connector mounting structure, which is well known in the art, is shown in FIGS. 4 and 5. In FIG. 4, reference numeral 1 designates a connector having a box-shaped connector housing 2 made of synthetic resin. The connector housing 2 has a pair of bosses 3 and 3 that are formed on both side regions of a bottom of the connector housing 2. Further, the connector housing 2 includes a plurality of terminals 4 in such a manner that the terminals 4 protrude outside of the housing 2.

The connector housing 2 is mounted on a printed circuit board 5 as follows. The bosses 3 and 3 are respectively inserted into a pair of fixing holes 6 and 6 that are formed in the printed circuit board 5, and each of the bosses 3 is heated so as to be deformed as indicated by the one-dot chain line in FIG. 5. That is, the connector housing 2 is fixedly mounted on the printed circuit board 5 by welding. A structure similar to the above-described connector mounting structure has been disclosed in Unexamined Japanese Utility Model Publication No. Hei. 6-60067.

However, the above conventional connector mounting structure suffers from the following drawbacks. When the connector housing 2 is fixedly mounted on the printed circuit board 5, it is essential to utilize special fixing members such as the bosses. Therefore, the number of components is increased, with a result that the manufacturing cost is increased accordingly. Additionally, the conventional connector mounting structure is low in workability, because in addition to the step of soldering terminals 4 to the printed circuit board 5, the step of fusing the bosses 3 with a thermal medium or the like is necessary.

SUMMARY OF THE INVENTION

An object of the present invention is to eliminate the above-described drawbacks accompanying the conventional connector mounting structure.

More specifically, an object of the present invention is to provide a connector mounting structure which is advantageous in that it needs no special fixing member, and the connector housing can be fixedly mounted on the base board easily and at low cost.

According to the first aspect of the present invention, there is provided a connector which comprises a connector housing having terminal accommodating chambers, terminals being respectively and integrally formed within each of the terminal accommodating chambers, wherein each of the terminals has a base board mounting portion protruding from a bottom of a respective one of the terminal accommodating chambers. This structure eliminates the requirement for special fixing parts. That is, the number of components is reduced, thereby resulting in decreased manufacturing cost.

According to the second aspect of the present invention, at least two of the terminals are employed as dummy terminals when the connector housing is mounted to the base board. That is, terminals that are the same terminals as the wire connecting terminals are used as the dummy fixing terminals.

According to the third aspect of the present invention, one of the at least two dummy terminals is located at each end of said housing.

In the connector mounting structure, both sides of the connector housing are fixedly secured through the dummy terminals to the printed circuit board. Hence, the resultant structure sufficiently withstands the load of tension of the covered wires connected to the plurality of press-connecting terminals, and the connector housing is kept fixedly mounted on the printed circuit board at all times.

According to the fourth aspect of the present invention, the base board includes insertion holes, and the fixing portion of each of the terminals of the connector housing protrudes from a rear surface of the base board through a respective one of the insertion holes. The fixing portions are secured to respective contacts formed on the rear surface of the base board by soldering.

With the connector mounting structure of the present invention, the fixing portions of the dummy terminals are secured to the contacts of the base boards by soldering, while simultaneously soldering the wire-connecting press-connecting terminals to patterns of the printed board. Hence, the connecting fixing work can be easily achieved.

DETAILED DESCRIPTION OF THE PREFERRED EMBODIMENT

A preferred embodiment of the invention will be described with reference to FIGS. 1 to 3.

A printed circuit board 10 has a rectangular shape. The printed circuit board 10 includes a plurality of terminal insertion holes 11 having a small, rectangular shape and being formed in a front end portion of the printed circuit board 10. Electrically conductive patterns (contacts) 12 are arranged on the rear surface 10b of the printed circuit board so that they surround the terminal insertion holes 11.

Figure 1:
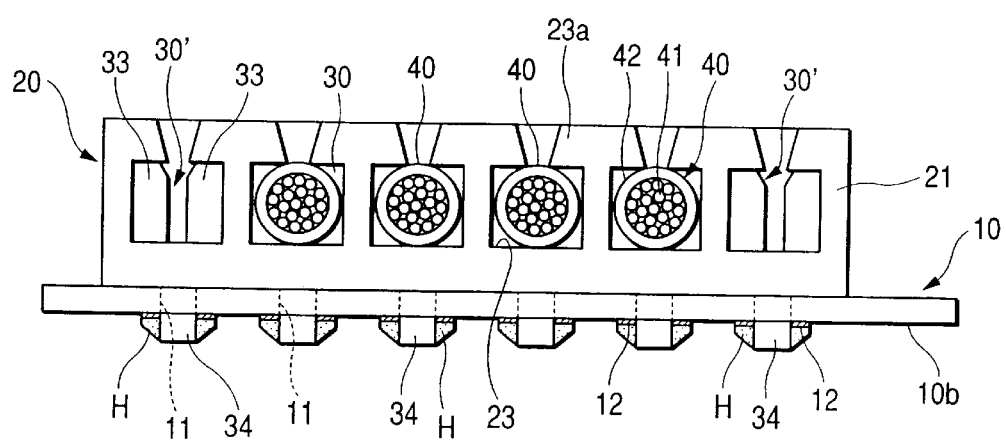
FIG. 1 is an explanatory diagram showing a printed circuit board and a connector mounted on the printed circuit board in a connector mounting structure of a preferred embodiment of the present invention.
Figure 2:
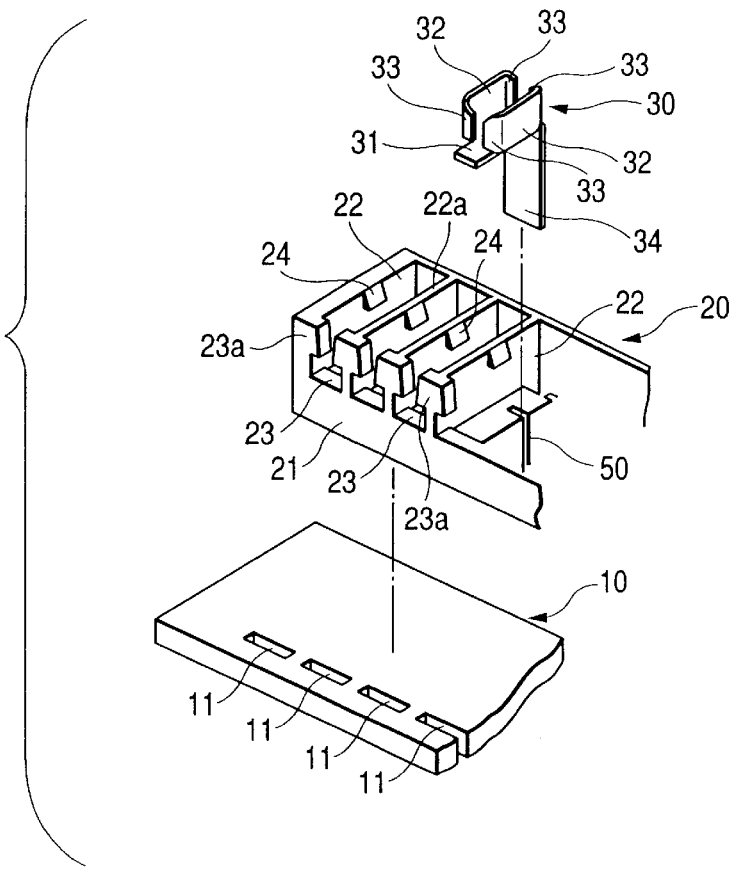
FIG. 2 is an exploded perspective view showing the FIG. 1 connector that is going to be mounted on the printed circuit board.
Figure 3:
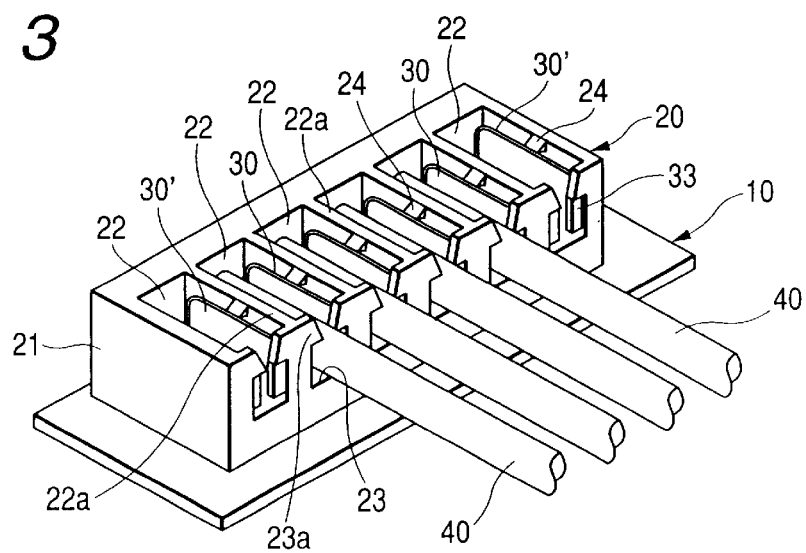
FIG. 3 is a perspective view showing the connector mounted on the printed circuit board of FIG. 1.
Figure 4:
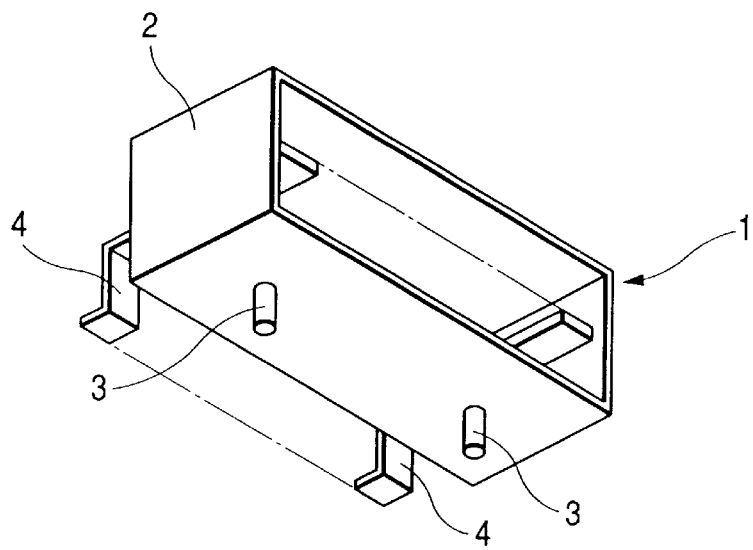
FIG. 4 is a perspective view of a conventional connector mounting structure.
Figure 5:
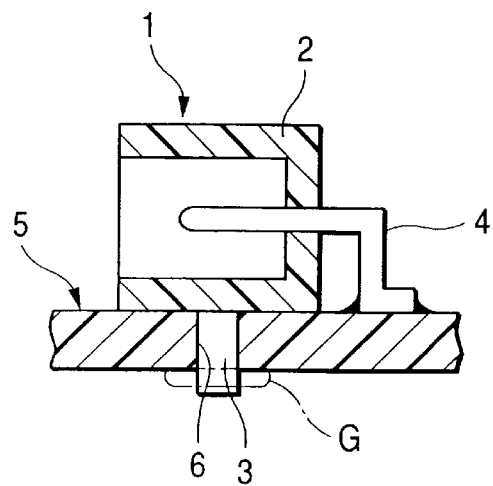
FIG. 5 is a sectional view of the connector mounted on the printed circuit board in the conventional connector mounting structure of FIG. 4.

As shown in FIGS. 1 through 3, a press-connecting connector 20 (hereinafter referred to merely as "a connector 20", when applicable) includes a box-shaped connector housing 21 made of synthetic resin. The connector housing 21 has a plurality of terminal accommodating chambers 22 formed in an upper portion thereof. The terminal accommodating chambers 22 are partitioned by partition walls 22a, respectively. A front wall of the box-shaped connector housing 21 has wire-holding openings 23 located at positions corresponding to the terminal accommodating chambers 22, respectively. The wire-holding openings 23 are communicated with V-shaped cuts 23a located above the wire-holding openings 23, so that covered wires 40 (hereinafter referred to as "wires 40", when applicable) can be readily pressed into the wire-holding openings 23. In the plurality of terminal accommodating chambers 22 of the connector housing 21, the rightmost terminal accommodating chamber 22 and the leftmost terminal accommodating chamber 22 are employed as fixing terminal accommodating chambers (or dummy terminal accommodating chambers) which are used when the connector housing 21 is mounted on the printed circuit board 10. The partition walls 22a, which are arranged in parallel with one another, have triangular prism-shaped terminal locking protrusions 24, respectively. Each of the terminal locking protrusions 24 is located at a middle of an upper edge of the respective partition wall 22a. Furthermore, through holes 50 are respectively formed in the terminal accommodating chambers 22. Each of the through holes 50 extends in a direction that is substantially perpendicular to a longitudinal direction of each of the terminal accommodating chambers 22.

As shown in FIGS. 1 through 3, each of the press-connecting terminals 30 accommodated respectively in the terminal accommodating chambers 22 of the connector housing 21 is designed as follows. A pair of side walls 32 and 32 are extended upwardly from both side edges of a bottom plate 31, respectively. Each of the side walls 32 has a pair of front and rear pressing blades 33 and 33 which are bent inwardly. The bottom plate 31 of each of the press-connecting terminals 30 has a rear end portion which is bent downwardly at right angles, thus being employed as a male tab (a fixing portion) 34. Those press-connecting terminals 30 may be integrally formed with the connector housing 21 by, for example, insert molding. The male tabs 34 of the press-connecting terminals 30 respectively penetrate the bottoms of the terminal accommodating chambers 22 of the connector housing 21 through the through holes 50 to protrude from the bottom of the connector housing 21.

The press-connecting terminals 30 accommodated in the pair of rightmost and leftmost terminal accommodating chambers 22 of the connector housing 21 are employed as dummy fixing terminals 30' that are used when the connector housing is mounted on the printed circuit board 10. The dummy fixing terminals 30' and the remaining press-connecting terminals 30 are equal in structure and in configuration to one another. That is, the terminals are used in accordance with the positions of the respective terminal accommodating chambers.

As shown in FIG. 1, each of the covered wires 40 includes a wire conductor 41, and an insulating cover 42 covering the wire conductor 41. A press jig (not shown) is used to press the insulating cover 42 of each of the wire 40 in between two pairs of front and rear press blades 33 and 33, so that the insulating cover 42 of the wire 40 is cut with the press blades 33, whereby the wire conductor 41 of the covered wire 40 is press-connected to the press blades 33. That is, the press-connecting terminal 30 is electrically connected to the covered wire 40.

As shown in FIG. 3, the covered wires 40 are press-fitted in between the pairs of front and rear press blades 33 of the press-connecting terminals 30 except for the rightmost and leftmost dummy fixing terminals 30' and 30' which are accommodated in the terminal accommodating chambers 22 of the connector housing 21. Under this condition, the connector housing 21 is mounted on the printed circuit board 10. At this time, the male tabs 34 of the press-connecting terminals 30 and the male tabs 34 of the dummy fixing terminals 30', which are protruded from the bottom of the connector housing 21, are inserted into the terminal insertion holes 11 of the printed circuit board 10, respectively. Thereafter, as shown in FIG. 1, the male tabs 34 of the press-connecting terminals 30 and the dummy fixing terminals 30', which are protruded from the rear surface 10b of the printed circuit board 10 are connected to the patterns 12 of the printed circuit board 10 by soldering. (In FIG. 1, reference character H designates the soldering patterns). Thus, as shown in FIGS. 1 and 3, the press-connecting connector 20 is fixedly mounted at a predetermined position on the printed circuit board.

As was described above, among the press-connecting terminals 30 accommodated in the terminal accommodating chambers 22 of the connector housing 21, the rightmost and leftmost ones are employed as the dummy fixing terminals 30' that are used when the connector housing 21 is mounted on the printed circuit board 10. That is, two of the wire connecting press-connecting terminals 30 are employed as dummy fixing terminals 30'. Accordingly, the preparation of special fixing parts is not needed, thereby reducing the number of components and manufacturing cost. In addition, the connector mounting structure of the present invention does not need any additional fixing parts for fixing the connector housing to the printed circuit board or a fixing parts mounting mechanism for mounting the fixing parts. Accordingly, the fixing work of the connector housing can be easily achieved.

Furthermore, since both sides of the connector housing 21 are fixedly mounted on the printed circuit board 10 using of the dummy fixing terminals 30', the resultant structure sufficiently withstands the load of tension from the covered wires 40 connected to the plurality of press-connecting terminals 30. That is, the dummy terminals more firmly anchor the housing connector to the base board without adding any additional load of tension from additional wires. As a result, the connector housing 21 is kept fixedly mounted on the printed circuit board at all times.

Furthermore, since both sides of the connector housing 21 are fixedly mounted on the printed circuit board 10 using of the dummy fixing terminals 30', the resultant structure sufficiently withstands stress caused by a difference between the thermal expansion coefficients of the connector housing 21 and the printed circuit board 10. That is, the reliability of the resultant structure is increased by the dummy fixing terminals.

Furthermore, the male tabs 34 of the dummy fixing terminals 30' are secured to the patterns of the printed circuit board 10 by soldering. This soldering work can be carried out while simultaneously securing the male tabs 34 of the wire connecting press-connecting terminals 30 to the patterns 12 of the printed circuit board 10. That is, the soldering work of the male tabs can be easily achieved.

In the above-described embodiment, the connector has a predetermined length and is fixedly mounted on the printed circuit board. However, the invention is not limited thereto or thereby. For example, a long connector may be formed, and the connector may be divided into parts having predetermined lengths, and the parts thus obtained may be fixedly mounted on the printed circuit board. Furthermore, in the above-described embodiment, the rightmost and leftmost press-connecting terminals are employed as dummy fixing terminals. However, the invention is not limited thereto or thereby. That is, depending on the length of the connector, a dummy fixing terminal or terminals may be provided between the rightmost and leftmost press-connecting terminals. Furthermore, the reliability of the resultant structure may be sufficiently obtained by using only one dummy fixing terminal for fixedly mounting the connector housing on the printed circuit board.

What is claimed is:

1. A connector mounting structure, comprising:

a base board;

a housing having a plurality of terminal accommodating chambers;

a plurality of terminals respectively disposed in said terminal accommodating chambers, said plurality of terminals including at least one electrical terminal and a pair of dummy terminals, respectively disposed at opposite ends of said housing relative to said at least one electrical terminal, an electrical wire only being connected to said at least one electrical terminal; and fastening means for fastening said housing to said based board, said fastening means consisting of fixing portions provided on said at least one electrical terminal and on said dummy terminals and passing through said based board to fix said terminals, and attendantly, said housing to said base board, whereby said housing is only indirectly fastened to said base board through said terminals.

2. The connector mounting structure of claim 1, wherein all of said at least one electrical terminal and said dummy terminals have the same shape, and said fastening means of said dummy terminals reinforces fastening of said housing to said base board by said fastening means of said at least one electrical terminal.

3. The connector mounting structure of claim 1, wherein said base board includes insertion holes, and the fixing portion of each of said terminals protrudes from a rear surface of said base board through a respective one of the insertion holes.

4. The connector mounting structure of claim 3, wherein the fixing portions are secured to respective contacts formed on the rear surface of said base board by soldering.

5. The connector mounting structure of claim 1, wherein said housing includes through holes respectively formed in bottoms of the terminal accommodating chambers, and wherein each of said fixing portions of said terminals penetrates through a respective one of said through holes.

6. The connector mounting structure of claim 5, wherein each of said through holes is extended in a direction substantially perpendicular to a longitudinal direction of each of the terminal accommodating chambers.

7. A connector mounting structure, comprising:

a base board;

a housing having a plurality of terminal accommodating chambers;

a plurality of terminals respectively disposed in said accomodating chambers, said plurality terminals including at least one electrical terminal and a pair of dummy terminals, respectively disposed at opposite ends of said housing relative to said at least one electrical terminal, an electrical wire only being connected to said at least one electrical terminal; and a plurality of fixing portions provided on said at least one electrical terminal and on said dummy terminals and passing through said base board to fix said terminals, and attendantly, said housing to said base board, whereby said housing is only indirectly fastened to said base board through said terminals, wherein all of said at least one electrical terminal and said dummy terminals have the same shape, and said fixing portions of said dummy terminals reinforce fastening of said housing to said base board by said fixing portion of said at least one electrical terminal.

8. The connector mounting structure of claim 7, wherein said base board includes insertion holes, and the fixing portion of each of said terminals protrudes from a rear surface of said base board through a respective one of the insertion holes.

9. The connector mounting structure of claim 8, wherein the fixing portions are secured to respective contacts formed on the rear surface of said base board by soldering.

10. The connector mounting structure of claim 7, wherein said housing includes through holes respectively formed in bottoms of the terminal accommodating chambers, and wherein each of said fixing portions of said terminals penetrates through a respective one of said through holes.

11. The connector mounting structure of claim 10, wherein each of said through holes is extended in a direction substantially perpendicular to a longitudinal direction of each of the terminal accommodating chambers.

* * * * *